United States Patent [19]

Matsumoto

[11] Patent Number: 5,072,178
[45] Date of Patent: Dec. 10, 1991

[54] METHOD AND APPARATUS FOR TESTING LOGIC CIRCUITRY BY APPLYING A LOGICAL TEST PATTERN

[75] Inventor: Takashi Matsumoto, Hadano, Japan
[73] Assignee: Hitachi, Ltd., Tokyo, Japan
[21] Appl. No.: 532,447
[22] Filed: Jun. 4, 1990

[30] Foreign Application Priority Data

Jun. 9, 1989 [JP] Japan .................................. 1-145112

[51] Int. Cl.⁵ ........................ G01R 31/28; G06F 11/00
[52] U.S. Cl. ............................... 324/158 R; 324/73.1; 371/15.1; 371/22.1
[58] Field of Search ........................ 324/73.1, 158 R; 371/27, 15.1, 22.3, 22.6, 16.1, 25.1

[56] References Cited

U.S. PATENT DOCUMENTS

| | | | |
|---|---|---|---|
| 3,764,995 | 10/1973 | Helf, Jr. et al. ............ | 324/73.1 |
| 4,500,993 | 2/1985 | Jacobson ...................... | 371/27 |
| 4,588,945 | 5/1986 | Groves et al. ............... | 324/73.1 |
| 4,849,702 | 7/1989 | West et al. .................. | 371/27 |
| 4,853,925 | 8/1989 | Azuma et al. ................ | 371/22.3 |
| 4,961,191 | 10/1990 | Nakagawa et al. ........... | 371/15.1 |

OTHER PUBLICATIONS

International Test Conference 1985 Proceedings, "The Future of Test", Nov. 19, 20, 21, 1985, The IEEE Computer Society, pp. 431-436.

Primary Examiner—Kenneth A. Wieder
Assistant Examiner—Vinh P. Nguyen
Attorney, Agent, or Firm—Fay, Sharpe, Beall, Fagan, Minnick & McKee

[57] ABSTRACT

A testing method of a logic circuit which can change test data in a testing apparatus and an apparatus which is used for the testing method are disclosed. The logic circuit testing apparatus having a first storage to store test data including a plurality of test patterns and a second storage to store each of the test patterns in correspondence to a group of tester pins further has a transfer circuit including a data converter to change the test patterns from the first storage and a third storage to store control data to control the data converter. The transfer circuit transfers each of the test patterns from the first storage to the second storage. When the test pattern is transferred by the transfer circuit, the test pattern is changed by the data converter by the control data.

13 Claims, 7 Drawing Sheets

| CONTROL | CONDITION | OUTPUT OF DATA CONVERTER | |
|---|---|---|---|
| | | SATISFIED | UNSATISFIED |
| 0 | — | DI | DI |
| 1 | DI0 = 0 | (DI·M) + DX | DI |
| 2 | DI1 = 0 | (DI·M) + DX | DI |
| 3 | DI2 = 0 | (DI·M) + DX | DI |
| 4 | DI0 = 1 | (DI·M) + DX | DI |
| 5 | DI1 = 1 | (DI·M) + DX | DI |
| 6 | DI2 = 1 | (DI·M) + DX | DI |
| 7 | — | DX | DX |

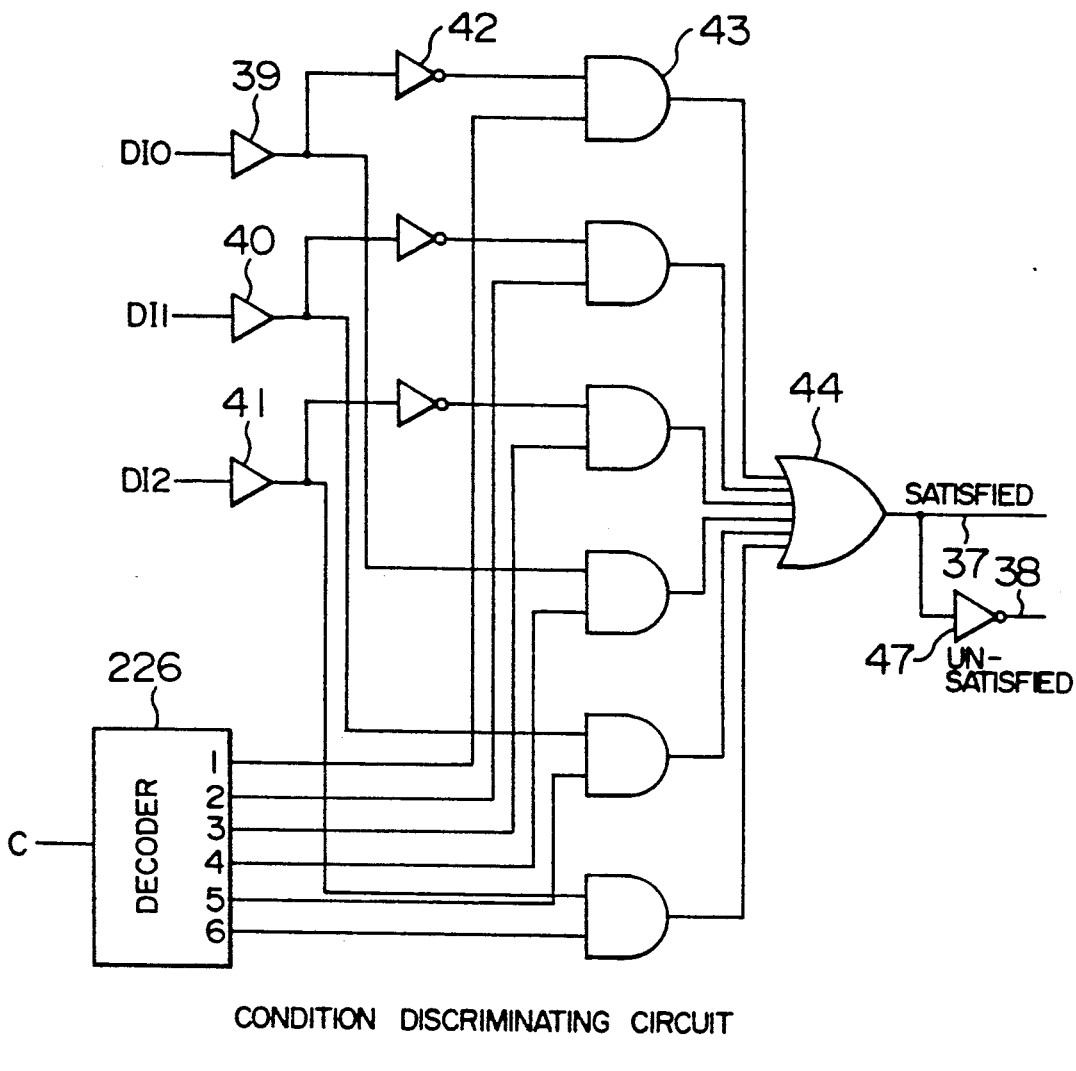

| CONTROL | OUTPUT OF DATA CONVERTER |
|---|---|
| 0 | DI |
| 1 | $\overline{DI}$ |
| 2 | (DI·M)+DX |
| 3 | DX |

METHOD AND APPARATUS FOR TESTING LOGIC CIRCUITRY BY APPLYING A LOGICAL TEST PATTERN

BACKGROUND OF THE INVENTION

The present invention relates to a logic circuit testing apparatus and, more particularly, to method and apparatus for testing a logic circuit which can change test data in a testing apparatus.

A very large amount of test data is necessary to test a logic circuit. The test data includes a number of test patterns. Ordinarily, the test data is almost completely automatically formed by a computer. In the testing apparatus, many test patterns are sequentially supplied to a group of tester pins. Bits of the test patterns are assigned to the corresponding tester pins.

As an example of such a logic circuit testing apparatus, an apparatus for scan-testing a VLSI has been disclosed in "INTERNATIONAL TEST CONFERENCE 1985 PROCEEDINGS", pages 431 to 436.

FIG. 10 shows the VLSI testing apparatus disclosed in the above literature. A disk 202 on which test data formed by a general purpose computer was recorded, a CRT 203 to display an operating state or the like, and a line printer 204 to print out the results of the tests are connected to a host CPU 201 comprising a general purpose computer. On the other hand, n logic test stations (LTSs) 21l to 21n are connected to the host CPU 201 by means of a block multiplexer channel, thereby enabling a plurality of VLSIs to be simultaneously tested.

In the scan test, the logic circuits to be tested are divided into a plurality of subnetworks in order to make it easy to execute the tests. Each of the subnetworks comprises: a group of input side latches; a group of output side latches; and a combination logic block among those latch groups. Each combination logic block scans in input data for tests to the input side latch group and then scans out the output data from the output side latch group and compares with expected values, thereby individually executing the tests. A series of test patterns are prepared for each subnetwork. Each bit of each test pattern is assigned to a virtual pin number of the corresponding subnetwork. The test data is transferred from the host computer to a test pattern buffer in the testing apparatus. The test patterns are sequentially transferred from the test pattern buffer to a local storage. Addresses in the local storage correspond to the sequence in which the data stored in the local storage is applied to the tester pin group. The bit position in each address corresponds to the tester pin number assigned to the bit. When each test pattern is transferred from the test pattern buffer to the local storage, a converter converts the virtual pin number into the address and bit position (tester pin number) in the local storage.

It is often confirmed that at the test execution stage, the test data needs to be partially changed. For instance, this is because the test data itself is improper or the test data formed on the basis of only a logic structure becomes improper due to an influence by circuit characteristics. However, as well as the above scan testing apparatus, conventional testing apparatuses cannot change the test data. The change of test data must be executed by other proper apparatus, for instance, a host computer. During the changing operation of test data, the tests are interrupted. On the other hand, there is a case where a temporary change is merely needed and there is no need to change the original test data. However, in such a case, in addition to the original test data, a complete combination of the test data which was partially changed must be made.

It is easy to merely provide a mechanism in which the user can change the content of the test pattern buffer. However, it is not easy to know at which position in the test pattern buffer the test pattern bit to be changed exists. Particularly, in the case of the foregoing scan testing apparatus, there is used a format in which a virtual pin number different from the tester pin number is used and a control information portion which is common to a series of test patterns is omitted and compressed. That is, the test is executed on a subnetwork unit basis and only the changed portion of the test pattern is sent. Therefore, it is fairly difficult to change the test data in the buffer storage.

SUMMARY OF THE INVENTION

It is an object of the invention to enable test data to be temporarily changed at the time point of the execution of a test as necessary in a testing apparatus.

Another object of the invention is to enable test data to be easily changed at a testing site without changing the original test data and to reduce the test interruption time and to also make it easy to change test data for scan test of a complicated structure.

According to the present invention, in a data transfer circuit from a first storage (for instance, a test pattern buffer in the scan testing apparatus) to hold test data to a second storage (for example, a local storage in the scan testing apparatus) to store each test pattern in correspondence to a tester pin, there are provided a data converter to change the test patterns from the first storage and a third storage to hold control data to control the data converter.

The data converter can include a logic circuit for selectively executing a plurality of kinds of logic operations between the original test pattern and data for change. In such a case, the above control data includes the data for change and operation designation information to designate arbitrary one of the plurality of kinds of logic operations.

Further, in the case where each test pattern in the first storage is accompanied with information to discriminate the pin number assigned to each bit of the test pattern, an address corresponding to the pin number is given to each storage position in the third storage. The reading position of the control data is designated by the pin number discrimination information which was read out together with the test pattern.

In the method and apparatus for testing logic circuits according to the invention, the data converter provided in the data transfer circuit changes the test pattern in the way of the transfer from the first storage to the second storage. The changing position, changing state, and the like can be easily designated by writing proper control data into the third storage. Therefore, the test pattern can be arbitrarily changed upon execution of the test without needing to change the original test data. Moreover, such a change is temporary and the original test data is held unchanged.

The change data portion of the control data can be set to an arbitrary desired value. In addition, one of a plurality of changing states (for instance, unchange, inversion of the original data, substitution by the change data, and the like) can be designated by the operation instruction portion. The logic circuit in the data converter executes the logic operation which was designated for the original test pattern and the data for change. Therefore, a variety of changes are possible.

Further, in the construction in which the third storage is accessed by the address corresponding to the pin number, by writing desired control data to the address position corresponding to a desired pin number, a desired change is realized. Consequently, even test data for scan test in which virtual pin numbers are used can be easily changed.

BRIEF DESCRIPTION OF THE DRAWINGS

These and other objects and advantages of the present invention will become apparent by reference to the following description and accompanying drawings, wherein:

FIG. 5 is a schematic diagram showing an example of a condition discriminating circuit in the circuit of FIG. 3;

FIG. 6 is a table showing the correspondence between test data bits and the meanings;

DESCRIPTION OF THE PREFERRED EMBODIMENTS

Figure 1:
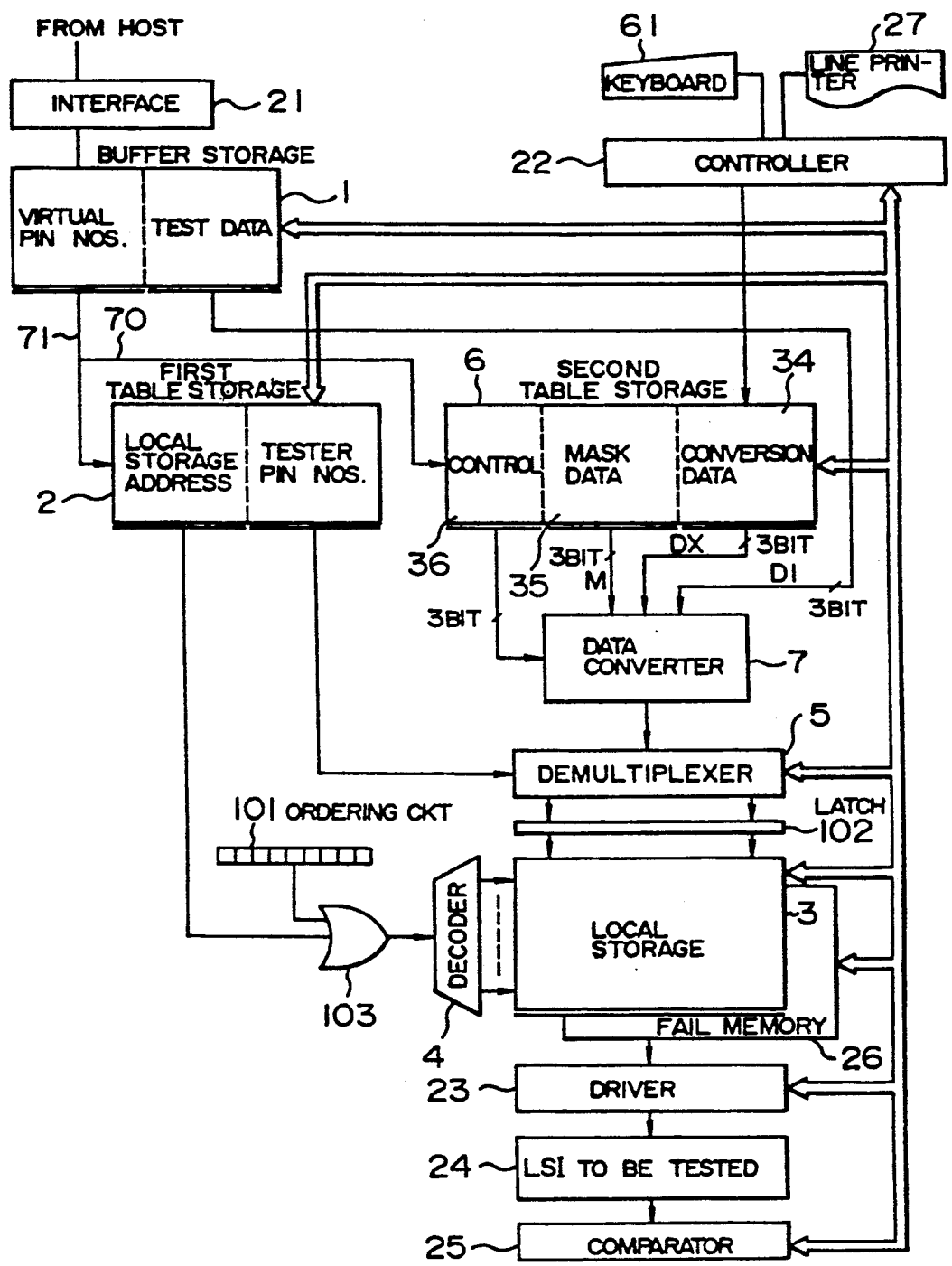
FIG. 1 is a block diagram showing an embodiment of a logic circuit testing apparatus according to the present invention.

FIG. 1 is a block diagram showing an embodiment of a logic circuit testing apparatus having a test data changing circuit according to the present invention. The testing apparatus can execute a scan test and a non-scan test. First, an example of the scan test will be described.

The original test data stored on a magnetic disk of a host CPU (not shown) includes not only test data (test patterns) but also table information and control information. On the basis of those information, a table storage is written and a controller 22 controls the apparatus. The original test data is transferred from the host CPU and stored into a buffer storage or first storage means 1 having an enough capacity through an interface 21 in correspondence to virtual pin numbers.

The virtual pin number is a pin number which was temporarily given to an input terminal of each input side latch and an output terminal of each output side latch of each subnetwork in a circuit to be tested. A first table storage 2 holds a table (corresponding to the conversion table disclosed in the above-mentioned literature) to convert the virtual pin numbers into addresses and bit positions (corresponding to the tester pin numbers) of a local storage or second storage means 3.

The virtual pin numbers corresponding to the test data which was read out of the buffer storage 1 are supplied as addresses into the first table storage 2. From the above address, the corresponding local storage address and the tester pin number in the local storage 3 are read out. The local storage address designates the corresponding address position in the local storage 3 through a decoder 4. The tester pin number is used to transfer the test data from a data converter or data convert means 7 to the corresponding bit position through a demultiplexer 5.

Figure 2:
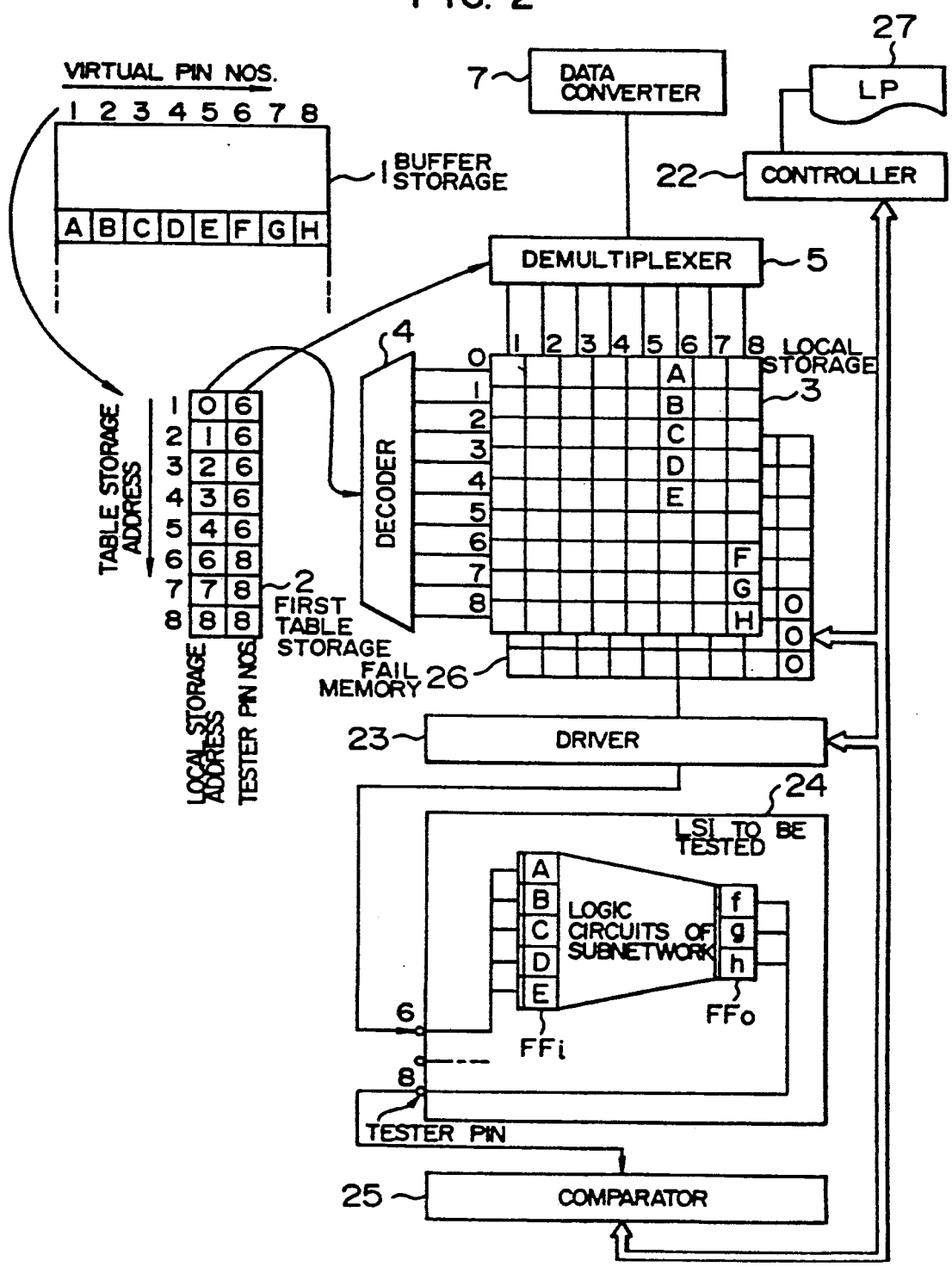
FIG. 2 is a schematic diagram for explaining a pin number converting function of the testing apparatus of FIG. 1.

FIG. 2 shows a schematic diagram of the pin number converting function of the first table storage 2 and tests of the logic circuit. It is now assumed that test patterns of a certain subnetwork unit in the buffer storage 1 are scan-in values A to E to be applied to virtual pins 1 to 5 and scan-out values F to H which are expected to be obtained from virtual pins 6 to 8. Each of the virtual pin numbers is converted into the local storage address and the tester pin number by the first table storage 2.

As mentioned above, the test patterns of the subnetwork unit are stored to the coordinate positions of the tester pin numbers and local storage addresses in the local storage 3. That is, the scan-in values A to E are stored to a tester pin number position 6 in local storage addresses 0 to 4. The scan-out values (output expected values) F to H are likewise stored to a tester pin number position 8 in local storage addresses 6 to 8. Due to this, one test pattern of the subnetwork unit is held in the local storage 3. Then, on the basis of instructions from the controller 22, a driver 23 reads out the scan-in values A to E from the local storage and scans in a group of input side flip-flops $FF_i$ through the tester pin 6 of an LSI 24 to be tested and executes tests of the logic circuits of the subnetwork. The results of the tests are held as scan-out values f to h into a group of output side flip-flops $FF_o$. The scan-out values f to h are accessed from the tester pin 8 and compared with expected values F to G stored in the local storage 3 by a comparator 25. The results of the comparisons are written into a fail memory 26. The fail memory 26 has a structure which is almost equal to a coordinate construction of the local storage. When the expected value and the scan-out value are equal, "0" is written as "Pass". When they are different, "1" is written as "Fail". The diagram shows an example in the case where the expected values F to H are respectively equal to the scan-out values f to h. Due to this, the tests of one subnetwork circuit are finished. The test data corresponding to the next subnetwork circuit is inputted to the local storage and similar tests are executed. By repeating the above operations, the tests of the logic circuit of the LSI are completed. In the test pattern to the local storage, only the changed portion different from the preceding test pattern is sent, that is, in a compressed form.

The results of the tests mentioned above are printed out by a line printer 27 by the controller 22. In the embodiment of the diagrams, although the line printer 27 is directly connected to the logic circuit testing apparatus, it is also preferable to connect the line printer to the host computer.

Returning to FIG. 1, in the conventional apparatus, test data DI which was read out of the buffer storage 1 is directly supplied to the demultiplexer 5. On the other hand, according to the invention, a second table storage 6 and the data converter 7 are provided. In a manner similar to the first table storage 2, the second table storage or third storage means 6 which includes areas for storage of control data, mask data, and conversion data, is addressed by the virtual pin numbers from the buffer storage 1. Control data, mask data M, and conversion data DX are held at each of the address positions. Those data are written into the second table storage 6 through a keyboard 61 as an input apparatus of the testing apparatus. The data converter 7 receives the mask data M and conversion data DX from the second table storage 6 and the test data DI from the buffer storage 1 as operands. The logic operations which are designated by the values of the control data from the second table storage 6 are executed to those operands. The results are sent to the demultiplexer 5.

The writing operation of data into the second table storage and the operands in the data converter 7 mentioned above will now be described in detail hereinbelow.

In the embodiment, each of the test data DI, conversion data DX, mask data M, and control data C is constructed by three bits. FIG. 6 is a table showing the meanings of the data bits of the test data DI and the conversion data DX. In "012" in the diagram, "0" is called a bit number 0, "1" is called a bit number 1, and "2" is called a bit number 2. In the case where the test data DX is, for instance, set to "001", "0" of the bit number 0 denotes that the logic value is set to "0", "0" of the bit number 1 denotes that the output of the circuit to be tested, and "1" of the bit number 2 denotes that the output expected value and the output are compared, respectively.

Hereinafter, for convenience of explanation, there is also a case where the bit number 0 is called the first bit, the bit number 1 is called the second bit, and the bit number 2 is called the third bit.

Figures 3, 4:
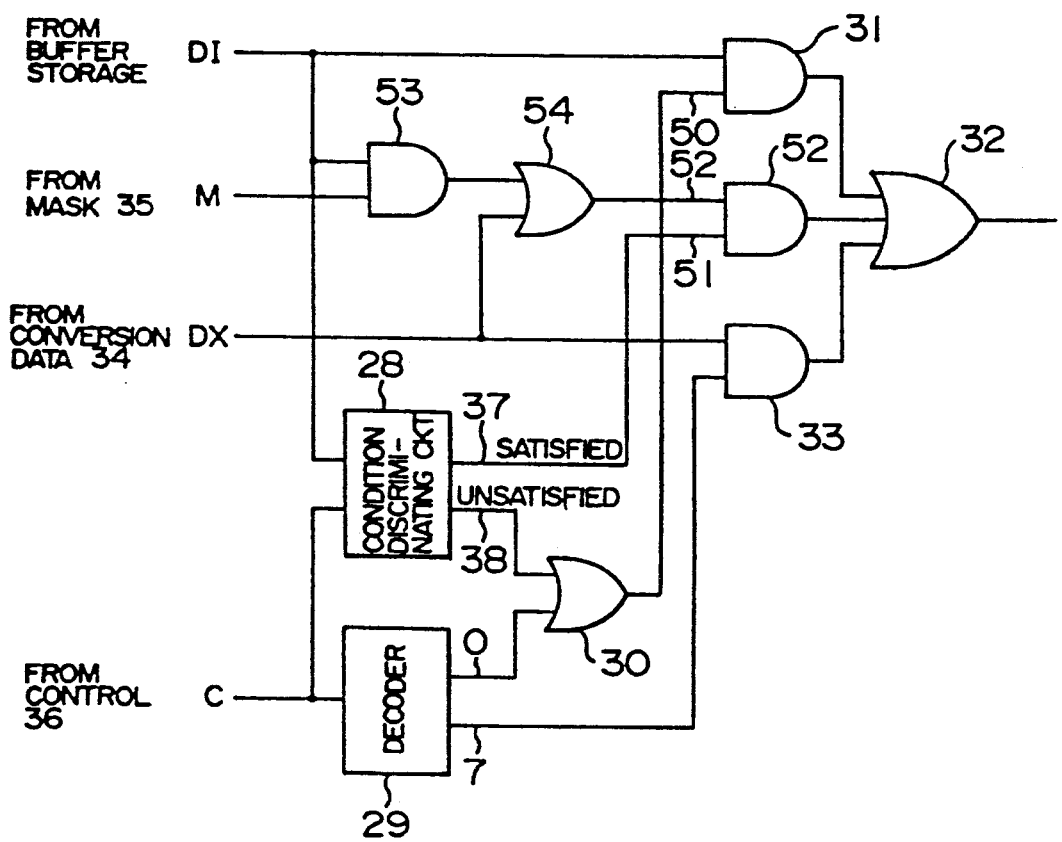
FIG. 3 is a table showing an embodiment of functions of a data converter in the testing apparatus of FIG. 1.
FIG. 4 is a schematic diagram showing an example of a circuit to realize the converting function shown in FIG. 3.

FIG. 3 shows a table of logic equations of an example of arithmetic operations which are executed by the data converter 7 in accordance with the value of the control data. FIG. 4 shows an example of a logic structure of the data converter 7. FIG. 5 shows an example of a logic construction of the condition discriminating circuit 28 of the data converter 7 in FIG. 4.

The operation of the logic circuit in FIG. 4 will now be described with respect to various control values as an example. First, consideration will now be made with respect to the case where the control value from a control 36 is set to "0", that is, the bit indication is set to "000". In this case, the 0 side terminal of a decoder 29 outputs high level, an output signal of an OR circuit 30 is set to the high level, and all of the test data DI from the buffer storage 1 are outputted through an AND circuit 31 and an OR circuit 32. On the other hand, when the control value is set to "7", that is, when a bit indication is set to "111", the 7 side terminal of the decoder 29 outputs high level and the conversion data DX from conversion data 34 is output through an AND circuit 33 and the OR circuit 32 irrespective of the value of the test data DI.

When the control values are set to "1" to "6", the designated bits of the test data DI are discriminated by the condition discriminating circuit 28. For instance, when the control value is set to "1", a check is made to see if DI0=0 or not, namely, the bit number 0 of DI is set to "0" or not. Such a discriminating process will now be further considered from a viewpoint of the correspondence of the meanings of the data bits. As shown in FIG. 6, a check is made to see if the logic value is set to "0" or not.

The discriminating operation will be described with reference to a logic circuit of the condition discriminating circuit in FIG. 5. The bit number 0 (DI0) of the test data DI is inputted to a buffer 39 from the buffer storage 1, the bit number 1 (DI1) is inputted to a buffer 40, and the bit number 2 (DI2) is inputted to a buffer 41, respectively.

As an example, the case of discriminating whether DI0=0 or not, that is, the case where the control value is set to "1" will now be considered. The control value "1" is sent from the control 36 and the 1st terminal of a decoder 226 is set to the high level. On the other hand, when DI0=0 (for instance, "000", "011", etc.), an output signal of an inverter 42 is set to the high level through the buffer 39. An output signal of an AND circuit 43 is set to the high level by the high-level output signal of the inverter 42 and the high-level signal from the 1st terminal of the decoder 226. The high-level output signal of the AND circuit 43 is transmitted through an OR circuit 44, so that a line 37 on the satisfied side is set to the high level. On the contrary, when DI0=1 (for instance, "110", "100", etc.), the output of the inverter 42 is set to the low level through the buffer 39, the AND circuit 43 is set to the low level, and the low-level output signal of the AND circuit 43 is transmitted through the OR circuit 44, and an output signal of the OR circuit 44 is inverted by an inverter 47, so that a line 38 on the unsatisfied side is set to the high level.

Returning to FIG. 4, the data converter 7 will be further explained. As mentioned above, the condition discriminating circuit discriminates whether the test data satisfies the condition designated by the control value or not. If it is not satisfied, the line 38 on the unsatisfied side of the circuit 28 is enabled. One input terminal 50 of the AND circuit 31 is set to the high level through the OR circuit 30. The test data is directly outputted through the AND circuit 31 and OR circuit 32. On the contrary, if the test data satisfies the condition designated by the control value, the line 37 on the satisfied side of the circuit 28 is enabled and one input terminal 51 of an AND circuit 52 is set to the high level. On the other hand, the AND (DI·M) of the test data DI from the buffer storage 1 and the data M from the mask data 35 is formed by an AND circuit 53. Further, the OR (DI·M)+(DX) of the value of the AND and the data DX from conversion data 34 is formed by an OR circuit 54. The OR signal is outputted through the OR circuit 32 because the input 51 of the AND circuit 52 is set to the high level. In the case where the control value is set to "2" to "6", its construction is almost similar to that in the case of the control value of "1". Therefore, its description is omitted.

Explanation will now be made with respect to the change in test data according to the embodiment and an example of the operation of the circuit of FIG. 4 in such a case.

Explanation will be made with regard to an example in the case of changing the original data DI at the virtual pin number 2 from "X0X" to "X00", that is, when the third bit is changed from "X" to "0". (In the above case, X is not limited to a special value, that is, it can be set to any one of "0" and "1"). First, "010110000" is written into address 2 (the same as the virtual pin number 2) of the second table storage 6 by the keyboard 61. As mentioned above, the second table storage 6 is addressed by the virtual pin number from the buffer storage 1.

In the above bits "010110000", the first three bits "010" are set to a control value, the middle three bits "110" are set to a master data value, and the last three bits "000" are set to a conversion data value.

First, the control value "010" corresponds to "2". When the bit number 1 of the test data DI is "0" (namely, DI1=0), the logic operation of (DI·M)+DI is executed. That is, on the basis of the control value C from the control 36, the data converter 7 changes the data when the test data DI is set to "X0X". (Refer to FIG. 3.)

When the data bits of the mask data M are set to "110", the AND operation (DI·M) with the test data DI is executed by the AND circuit 53 in FIG. 4. That is, the first two bits of the test data DI are not changed but the third bit (bit number 2) is changed. In other words, the first and second bits "1" of the mask data "110" function as a mask. Even if the first and second bits of the test data bits are set to "1" or "0", the AND circuit 53 does not change those bits. On the other hand, the third bit "0" is passed when the third bit of the test data is set to "0". However, when it is set to "1", it is changed to "0" by the AND circuit 53.

The value of the conversion data DX and the DI·M mentioned above are ORed by the OR circuit 54 in FIG. 4 and the result is output as ((DI·M)+DX). That is, in the above example, since the change data values are set to "000", the first two bits are unchanged, so that they are set to "00", while the third bit "0" is output.

If the data is not changed here, it is sufficient to write "000XXXXXX" (control value 0) into the second table storage. When all of the bits are changed, it is sufficient to write "111XXXXXX" (control value 7) into the second table storage. (For instance, by writing "111XXX000", all of the test data are rewritten to "000"). The writing operation into the second table storage is executed by writing the data into only the address of the virtual pin number to be changed.

By writing desired control data to the position corresponding to a desired pin number, it is possible to easily change in the embodiment.

Ordinarily, the second table storage has been cleared (state of unchange) and if it is necessary to change the data, new data is written.

Figures 7, 8:
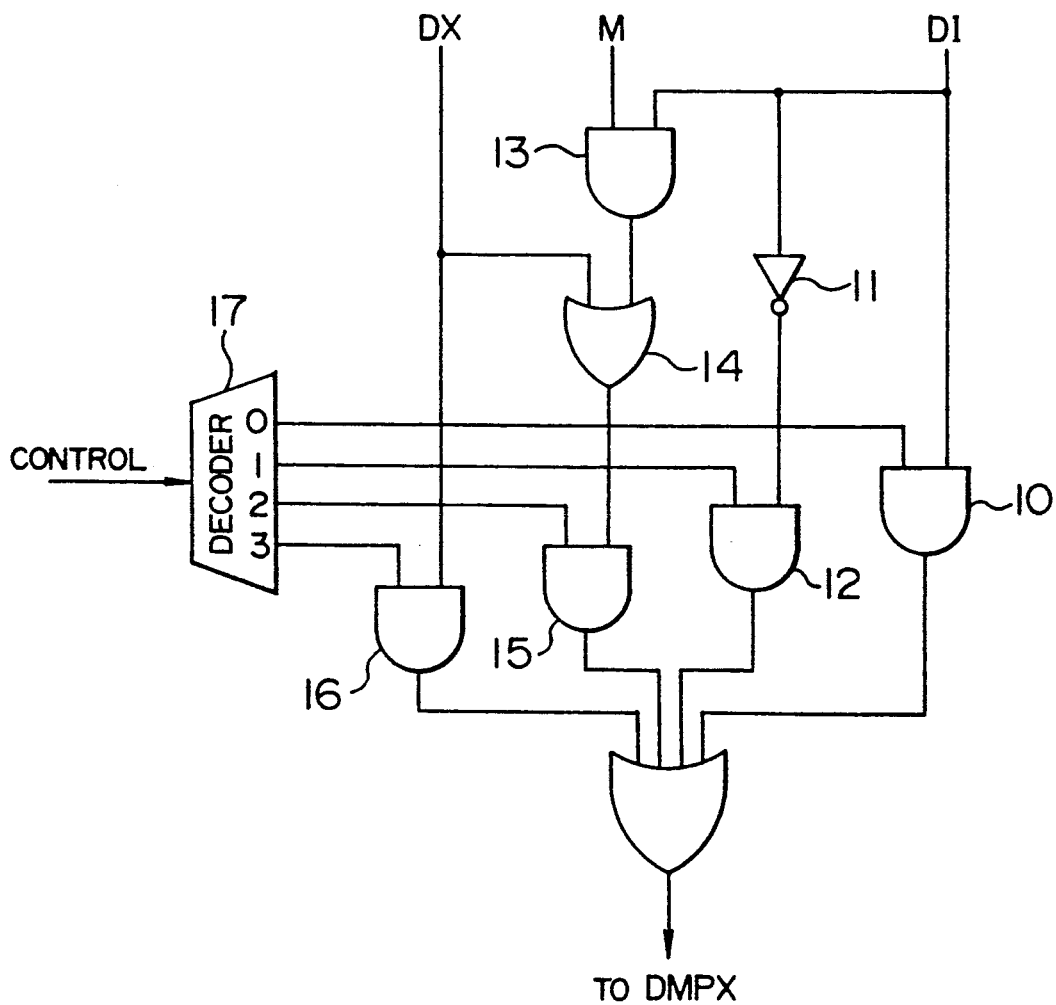
FIG. 7 is a table showing function other than those in FIG. 3 in the data converter in the testing apparatus of FIG. 1.
FIG. 8 is a diagram showing an example of a circuit to realize the converting function shown in FIG. 7.

FIG. 7 shows a table of logic equations to execute other logic operations different from those in FIG. 3 in accordance with the value of the control data by the data converter 7. FIG. 8 shows an example of a logic structure of the data converter 7 by the logic equations. In the circuit:

When the control data is "0", the test data DI from the buffer storage 1 is directly obtained through an AND gate 10. When the control data is "1", the inverted data $\overline{DI}$ of the test data is derived through an inverter 11 and an AND gate 12. When the control data is "2", and logic operation (DI·M) is executed in an AND gate 13, and OR logic operation (DI·M)+DX) is executed in an OR gate 14, thereby ORed logic is obtained through an AND gate 15. When the control data is "3", the conversion data DX is directly obtained through an AND gate 16. The selection of the AND gates 10, 12, 15, and 16 is executed by a decoder 17 to decode the control data.

In the embodiment of FIG. 8, the logic operation value ((DI·M)+DX) has been obtained by using the AND gates 13 and 15 and the OR gate 14. As further another embodiment, it is also possible to use a further simplified modification in which those gates are omitted, the test data DI is obtained by the control value 0, the inverted data $\overline{DI}$ of the test data is obtained by the control value 1, and the conversion data DX value is obtained by the control value 3, or the like.

As mentioned above, by setting the data at the address position corresponding to a desired virtual pin number in the second table storage 6 to a proper value, a part of the test data can be temporarily changed at the time point of the execution of the test.

The scan test has been described above. An example of the non-scan test by the testing apparatus in the embodiment will now be described.

Figure 9:
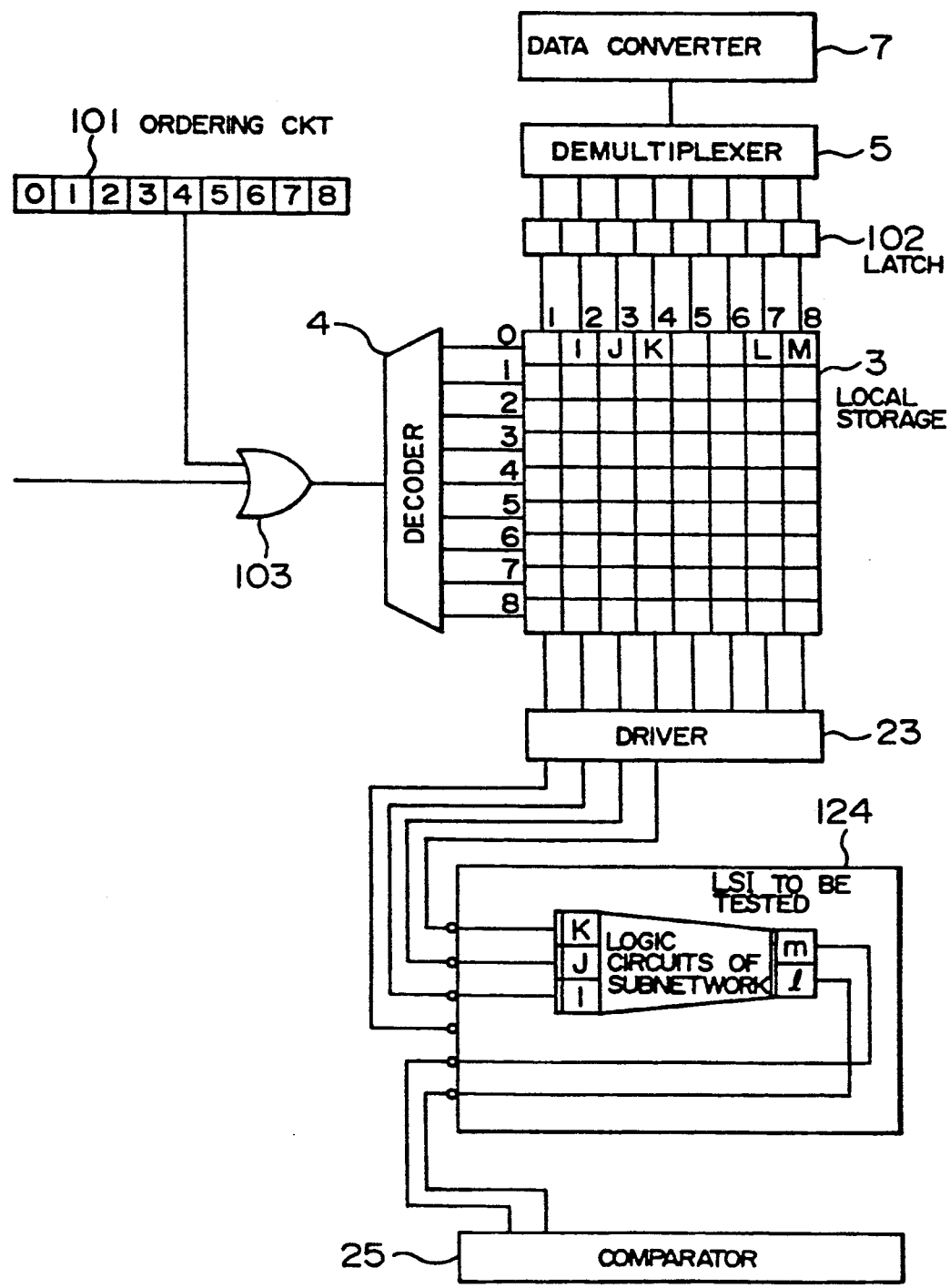
FIG. 9 is a schematic diagram for explaining the functions in a non-scan test of a logic test station.
Figure 10:
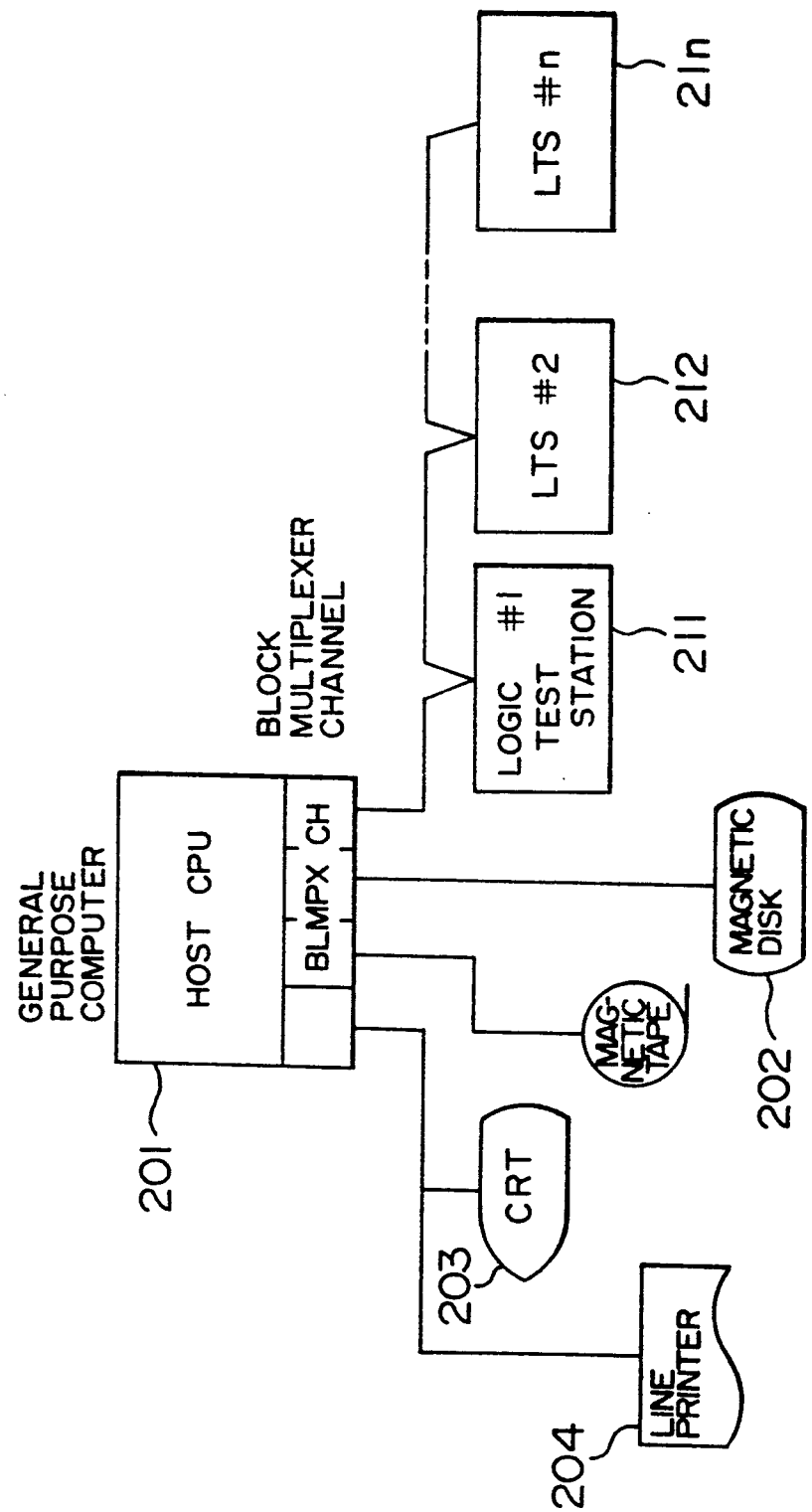
FIG. 10 is a diagram showing the outline of a conventional VLSI testing apparatus.

FIG. 9 shows a schematic diagram of the writing operation of the test data and expected values to the local storage in the case of the non-scan tests in the logic circuit testing apparatus of FIG. 1. Reference numeral 101 denotes an ordering circuit. In the scan tests, the addresses in the local storage have been input from the table storage 2. However, in the non-scan tests, the ordering circuit designates the order (for instance, 0, 1, 2, . . . ) to execute the tests into the local storage 3 through an OR circuit 103 and the decoder 4. On the other hand, the test data from the data converter 7 is held into a latch 102 through the demultiplexer 5 and written into the local storage on the basis of the order designated by the ordering circuit by a signal from a controller (not shown).

As mentioned above, the ordering circuit 101 designates the order of the test data. In correspondence to the order, the test data is sequentially written from the latch 102 to the local storage. The test patterns which were written as mentioned above are added to a circuit 124 to be tested in a non-scan manner and the tests are executed. Since a procedure to execute the above tests are almost similar to the procedure mentioned in the scan tests, its description is omitted.

The latch 102 passes the data during the scan tests.

While particular embodiments of the present invention have been shown and described, it will be obvious to those skilled in the art that various changes and modifications may be made without departing from the present invention in its broader aspects.

What is claimed is:

1. A logic circuit testing apparatus comprising:
   a first storage means for storing test data including a plurality of logical test patterns;
   a second storage means for storing each of the logical test patterns in correspondence to a group of tester pins;
   a third storage means for storing control data to control a data convert means;
   a data convert means for converting data from said first storage means on the basis of the control data stored in said third storage means;
   a test means for testing a logic circuit which applies the logical test patterns from said second storage means to the logic circuit; and
   control means for selectively controlling each of the first, second, and the third storage means, the data convert means, and the test means,
   said control means transferring the test data from the first storage means, via the data convert means which logically converts the data on the basis of the control data from the third storage means or directly, to the second storage means to be stored as a logical test pattern, said control means transferring logical test pattern stored in the second storage means to the test means to test the logic circuit.

2. An apparatus according to claim 1, wherein each of the logical test patterns in the first storage means is accompanied with information to designate a pin number assigned to each bit of each logical test pattern, each of the storing positions in the third storage means has an address corresponding to the pin number, and a reading position of the control data is designed by the pin number discrimination information which was read out of the first storage means together with the logical test pattern.

3. A logic circuit testing apparatus comprising:
a first storage means for storing logic circuit test data including a plurality of logical test patterns;
a second storage means for storing each of the logical test patterns in correspondence to a group of tester pins;
a third storage means for storing control data to control a data convert means;
a data convert means for converting data from said first storage means on the basis of the control data stored in said third storage means;
wherein said data convert means includes a logic circuit to selectively execute a plurality of kinds of logic operations between the logical test patterns from the first storage means and data representative of change of the test data stored in the third storage means, and said control data includes said data representative of a change of the test data and operation designation information to designate arbitrary one of said plurality of kinds of logic operations, a test means for testing a logic circuit which applies the logical test patterns from said second storage means to the logic circuit.

4. An apparatus according to claim 3, wherein each of the logical test patterns in the first storage means is accompanied with information to designate a pin number assigned to each bit of each logical test pattern, each of the storing positions in the third storage means has an address corresponding to the pin number, and a reading position of the control data is designated by the pin number discrimination information which was read out of the first means storage together with the logical test pattern.

5. An apparatus according to claim 3, wherein the logical test pattern held in the first storage means is replaced to the changing data by the data convert means by the designation of the operation designation information.

6. An apparatus according to claim 3, wherein the logical test pattern held in the first storage means is inverted by the designation of the operation designation information.

7. An apparatus according to claim 3, wherein the logical test pattern held in the first storage means is outputted from the logic circuit by the designation of the operation designation information.

8. An apparatus according to claim 3, wherein the logic circuit includes a discriminating circuit to discriminate whether the logical test pattern satisfies the condition designated by the operation designation information or not.

9. An apparatus according to claim 8, wherein in the case where it is determined by the discriminating circuit that the logical test pattern satisfies the condition designated by the operation designation information, the logic circuit executes the logic operation between the logical test pattern and at least the data for change of the test data.

10. An apparatus according to claim 8, wherein in the case where it is determined by the discriminating circuit that the logical test pattern does not satisfy the condition designated by the operation designation information, the logic circuit outputs the logical test pattern.

11. A method for testing a logic circuit comprising the steps of:
holding test data including a plurality of logical test patterns in a first storage;
holding control data in a third storage;
changing logically the logical test patterns from the first storage on the basis of control data from a third storage to transfer to a second storage;
holding the transferred logical test patterns into the second storage in correspondence to a group of test pins; and
applying the logical test pattern held in the second storage to said logic circuit.

12. A method according to claim 11, wherein said data changing step includes the steps of:
designating arbitrary one of a plurality of kinds of logic operations by operation designation information; and
executing the logic operation on the basis of the operation designation information.

13. A method according to claim 12, wherein in the step of executing the logic operation, further, a check is made to see if the logical test pattern satisfies the condition designated by the operation designation information or not and the logic operation is executed on the basis of the result of such a discrimination.

* * * * *